(12) United States Patent
Melman

(10) Patent No.: US 8,597,963 B2
(45) Date of Patent: Dec. 3, 2013

(54) MANUFACTURE OF LIGHT EMITTING DEVICES WITH PHOSPHOR WAVELENGTH CONVERSION

(75) Inventor: Jonathan Melman, San Ramon, CA (US)

(73) Assignee: Intematix Corporation, Fremont, CA (US)

( * ) Notice: Subject to any disclaimer, the term of this patent is extended or adjusted under 35 U.S.C. 154(b) by 98 days.

(21) Appl. No.: 12/782,819

(22) Filed: May 19, 2010

(65) Prior Publication Data

US 2010/0295077 A1  Nov. 25, 2010

Related U.S. Application Data

(60) Provisional application No. 61/179,661, filed on May 19, 2009.

(51) Int. Cl.
*H01L 21/78* (2006.01)
(52) U.S. Cl.
USPC ............... 438/26; 438/33; 438/460; 438/463; 257/E21.599
(58) Field of Classification Search
USPC .................. 438/28, 26, 33, 460, 463
See application file for complete search history.

(56) References Cited

U.S. PATENT DOCUMENTS

| | | | |
|---|---|---|---|
| 5,609,746 A * | 3/1997 | Farrar et al. | 205/125 |
| 5,998,925 A | 12/1999 | Shimizu | |
| 6,114,048 A * | 9/2000 | Jech et al. | 428/547 |
| 6,120,131 A * | 9/2000 | Murthy et al. | 347/47 |
| 6,515,417 B1 * | 2/2003 | Duggal et al. | 313/506 |
| 7,049,159 B2 | 5/2006 | Lowery | |
| 7,311,858 B2 | 12/2007 | Wang | |
| 7,344,952 B2 | 3/2008 | Chandra | |
| 7,390,437 B2 | 6/2008 | Dong | |
| 7,575,697 B2 | 8/2009 | Li | |
| 7,601,276 B2 | 10/2009 | Li | |
| 7,804,099 B2 * | 9/2010 | Beeson et al. | 257/89 |
| 8,173,246 B2 * | 5/2012 | Nashiki et al. | 428/212 |
| 2002/0097962 A1 * | 7/2002 | Yoshimura et al. | 385/50 |
| 2004/0061056 A1 * | 4/2004 | Barton et al. | 250/338.4 |
| 2004/0207323 A1 * | 10/2004 | Erchak et al. | 313/581 |
| 2005/0274967 A1 | 12/2005 | Martin et al. | |
| 2006/0097621 A1 | 5/2006 | Park et al. | |
| 2006/0158090 A1 | 7/2006 | Wang et al. | |
| 2006/0284207 A1 | 12/2006 | Park et al. | |
| 2007/0029526 A1 | 2/2007 | Cheng et al. | |
| 2008/0042153 A1 * | 2/2008 | Beeson et al. | 257/94 |
| 2008/0076198 A1 | 3/2008 | Park et al. | |

(Continued)

*Primary Examiner* — John C Ingham
(74) *Attorney, Agent, or Firm* — Quine Intellectual Property Law Group, P.C.

(57) ABSTRACT

A method of manufacturing a light emitting device: an LED wafer having an array of LEDs formed on a surface thereof, the method comprises: a) fabricating a sheet of phosphor/polymer material comprising a light transmissive polymer material having at least one phosphor material distributed throughout its volume and in which the polymer material is transmissive to light generated by the LEDs and to light generated by the at least one phosphor material; b) selectively making apertures through the phosphor/polymer sheet at positions corresponding to electrode contact pads of the LEDs of the LED wafer; c) attaching the sheet of phosphor/polymer material to the surface of the LED wafer such that each aperture overlies a respective electrode contact pad; and d) dividing the wafer into individual light emitting devices. The method can further comprise, prior to dividing the LED wafer, cutting slots through the phosphor/polymer material that are configured to pass between individual LEDs.

16 Claims, 13 Drawing Sheets

(56) References Cited

U.S. PATENT DOCUMENTS

| | | |
|---|---|---|
| 2008/0111472 A1 | 5/2008 | Liu et al. |
| 2009/0117672 A1 | 5/2009 | Caruso et al. |
| 2009/0134414 A1 | 5/2009 | Li et al. |
| 2009/0179207 A1* | 7/2009 | Chitnis et al. .................. 257/88 |
| 2009/0283721 A1 | 11/2009 | Liu et al. |

* cited by examiner

MANUFACTURE OF LIGHT EMITTING DEVICES WITH PHOSPHOR WAVELENGTH CONVERSION

CROSS-REFERENCE TO RELATED APPLICATIONS

This application claims the benefit of priority of U.S. Provisional Application No. 61/179,661, filed May 19, 2009, the contents of which are incorporated herein by reference.

BACKGROUND OF THE INVENTION

1. Field of the Invention

The invention relates to methods of manufacture of light emitting devices with phosphor wavelength conversion. More particularly the invention concerns a method of applying a phosphor material to a light emitting diode (LED).

2. Description of the Related Art

White light emitting LEDs ("white LEDs") are known in the art and are a relatively recent innovation. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip or die generates blue light and the phosphor(s) absorbs a percentage of the blue light and re-emits yellow light or a combination of green and red light, green and yellow light, green and orange or yellow and red light. The portion of the blue light generated by the LED that is not absorbed by the phosphor combined with the light emitted by the phosphor provides light which appears to the human eye as being nearly white in color.

An example of the manufacture of a gallium nitride (GaN) based white LED is shown schematically in FIGS. 1a to 1d. As shown in FIG. 1a an LED wafer 10 comprises a wafer (substrate) 12, typically sapphire, that has one or more layers of n-type gallium nitride 14 and p-type gallium nitride 16 materials epitaxially grown on its surface and configured to define a plurality of LED chips 18. Each LED chip 18 has respective n-type and p-type electrode pads 20, 22 on its upper surface for providing electrical connection to the chip. As is known in other device structures one or both electrode pads 20, 22 can be provided on the substrate side of the LED. To fabricate a white LED the LED wafer is 10 is divided (diced) into individual LED chips 18 by for example laser scribing and breaking or by mechanical sawing using a diamond saw (FIG. 1b). Each LED chip 18 is then individually mounted in a package (housing) 24 or mounted to a lead frame (FIG. 1c).

The package 24, which can for example comprise a low temperature co-fired ceramic (LTCC) or high temperature polymer, comprises upper and lower body parts 26, 28. The upper body part 26 defines a recess 30, often circular in shape, which is configured to receive one or more LED chips 18. The package 24 further comprises electrical connectors 32, 34 that also define corresponding electrode contact pads 36, 38 on the floor of the recess 30. Using adhesive or soldering the LED chip 18 is mounted to the floor of the recess 30. The LED chip's electrode pads 20, 22 are electrically connected to corresponding electrode contact pads 36, 38 on the floor of the package using bond wires 40, 42. The recess 30 is then completely filled with a transparent polymer material 44, typically a silicone, which is loaded with the powdered phosphor material(s) such that the entire surface of the LED chip is covered by the phosphor/polymer mixture. To enhance the emission brightness of the device the inner walls of the recess 30 are often inclined and light reflective. Optionally, a lens (not shown), whose dimensions correspond to the dimensions of the recess, is mounted on the package to focus or otherwise direct the light emission of the device.

A drawback with such a method of manufacture is cost, since phosphor has to be applied to the LED chip on an individual basis. In addition the color hue of light generated by the device, or in the case of a white light emitting device the correlated color temperature (CCT), can vary significantly between devices that are supposed to be nominally the same. The problem of color/CCT variation is compounded by the fact that the human eye is extremely sensitive to subtle changes in color hue especially in the white color range. As is known, the correlated color temperature (CCT) of a white light source is determined by comparing its hue with a theoretical, heated black-body radiator. CCT is specified in Kelvin (K) and corresponds to the temperature of the black-body radiator which radiates the same hue of white light as the light source. The CCT of a white LED is generally determined by the phosphor composition, the quantity of phosphor incorporated in the device and its actual location/distribution.

As well as the variation between devices in the color/correlated color temperature (CCT) of emitted light, it is found that the color/CCT can vary across the light emitting surface of the device. The color/CCT depends on the thickness of phosphor/polymer and the distance (i.e. path length) that light travels from the LED chip through the phosphor/polymer encapsulation before being emitted from the device. As shown in FIG. 2, light 46 which is emitted substantially on axis will have traveled a shorter path length 48 within the phosphor/polymer encapsulation than light 50 emitted off axis towards the periphery of the device in which the path length 52 is correspondingly longer. As a result the light 46 emitted substantially on axis will have a higher proportion of blue light compared to yellow (phosphor generated light) and will appear to be blue-white in color. Conversely light 50 emitted off axis towards the periphery of the recess will have a correspondingly higher proportion of yellow light emitted by the phosphor and will appear yellow-white in color. For general lighting applications, where for example a diffuser is used, this variation in color is not a problem as the lit object itself will also increase illumination color uniformity.

Furthermore, in applications in which the device includes further optical components, in particular a lens, to focus the output light, such color/CCT variation can become a significant problem. For example for a white LED which includes a lens, the focused light spot will have a blue-white core with a pronounced yellow-white periphery.

In addition to the problem of non-uniformity in emitted color/CCT due to the variation in path length through the phosphor/polymer encapsulation, it is found that the phosphor material(s) can accumulate unevenly during curing of the liquid polymer resulting in a non-uniform distribution of the phosphor material(s) over the LED chip and in particular on the edges of the LED chip, which will also emit light, where there may be little or no phosphor material(s). As illustrated in FIG. 2 the phosphor material can accumulate on the bond wires 54, on the upper surface 56 of the LED chip, on the floor 58 of the recess and on the inclined light reflective walls 60 of the package. To overcome this problem a greater quantity of phosphor material is often used though this will result in a corresponding decrease in emitted light intensity. The inventor has appreciated that the variation in color hue can additionally depend on factors including:

variations in bonding wire shape and location which can affect the wetting of the phosphor adhesive bleed out which can affect the wetting of the phosphor variations in emission direction of the LED chip variations in the reflector characteristic variations or aging in the phosphor/silicone blend wavelength emission distribution of LED chips.

It is believed that all of these factors can affect the color hue/CCT of light generated by a light emitting device with phosphor wavelength conversion.

US 2006/0097621 teaches a method of manufacturing a white LED comprising dispensing droplets of a high viscosity liquid phosphor paste on an upper surface of the LED such that the phosphor paste is applied onto the upper surface and side surfaces of the LED and then curing the phosphor paste. The phosphor paste comprises a phosphor powder mixed with a transparent polymer resin and has a viscosity of 500~10,000 cps. The volume of the phosphor paste droplet and viscosity of the phosphor paste are selected such that the phosphor paste covers the upper surface and side surfaces of the LED and allows the phosphor paste to be uniformly applied to the side surfaces as well as the upper surface. After application of the phosphor paste the polymer resin is cured and the LED chip is connected to the package using bond wires. Finally the package is filled with a transparent polymer material to protect the bond wires.

As taught in our co-pending United States patent application publication No. US 2009/0134414, published Oct. 22, 2009, a method of fabricating a light emitting device comprises: heating a light emitting diode chip package assembly to a pre-selected temperature and dispensing a pre-selected volume of a mixture of at least one phosphor and a light transmissive thermosetting material (silicone, epoxy) on a surface of the LED chip. The pre-selected volume and temperature are selected such that the phosphor/material mixture flows over the entire light emitting surface of the LED chip before curing. In an alternative method, using a light transmissive UV curable material such as an epoxy, the phosphor/material mixture is irradiated with UV radiation after a pre-selected time to cure the material. The pre-selected volume and pre-selected time are selected such that the phosphor/material mixture flows over at least the light emitting surface of the LED chip before curing.

To alleviate the problem of color variation in light emitting devices with phosphor wavelength conversion, in particular white LEDs, are categorized post-production using a system of "bin out" or "binning." In binning, each LED is operated and the actual color of its emitted light measured. The LED is then categorized or binned according to the actual color of light the device generates rather than according to the target CCT with which it was produced. A disadvantage of binning is increased production costs and a low yield rate as often only two out of the nine bins are acceptable for an intended application resulting in supply chain challenges for white LED suppliers and customers.

Various methods of applying the phosphor to the LED chip have been proposed in an effort to improve coating uniformity and color hue and CCT consistency. For example, US 2008/0076198 describe a method of manufacturing an LED package comprising: forming a resin mold encapsulating an LED chip and then forming a phosphor thin film on a surface of the resin mold by spray coating a phosphor-containing material on the surface of the resin mold.

U.S. Pat. No. 7,344,952 describe a process for manufacturing LEDs that utilize phosphor wavelength conversion. LED dies (chips) are tested for CCT and binned according to their color emission. The LEDs in a single bin are mounted on a single submount (substrate) to form an array of LEDs. Various thin sheets of a flexible encapsulant (e.g. silicone) containing one or more phosphors are preformed, where each sheet has different color conversion properties. An appropriate sheet is place over an array of LEDs on a submount, and the LEDs are energized. The CCT of the emitted light is measured. If the CCT is acceptable, the phosphor sheet is permanently laminated onto the LEDs and submount. The LEDs in the array are separated into individual devices. By selecting a different phosphor sheet for each bin of LEDs, the resulting CCT is more consistent across the bins. Although such a process can produce LEDs with a more consistent CCT both the LED dies and phosphor sheet need to be binned and this can make the process expensive.

US 2005/0274967 teaches producing a sheet of wavelength converting (phosphor containing) material and then dividing the sheet into individual caps or elements. The light conversion characteristic of each cap is then measured and the caps binned according to their characteristic. The light emission characteristic of each packaged LED is measured and an appropriate cap bonded to the LED to produce a desired CCT of emitted light. Although this process can produce LEDs with a desired CCT, binning of LEDs and phosphor caps is required and this can make the process time consuming and expensive.

U.S. Pat. No. 7,049,159 describe forming a luminescent layer on light emitting devices that are mounted on a substrate. The method comprises positioning a stencil on a substrate such that the light emitting devices are located within a respective opening of the stencil, depositing a composition including the luminescent material in the opening, removing the stencil and curing the composition to a solid state.

US 2006/0284207 teach applying the phosphor material during formation of the LED package. LED chips are electrically connected to pattern electrodes on a substrate such as a PCB or ceramic substrate. Next an encapsulant, epoxy molding compound (EMC), containing the phosphor material is formed on each LED chip by transfer (injection) molding. After curing the encapsulant is cut around the periphery of the chip and a layer of a highly reflective metal formed on the periphery of the encapsulant by electrolysis, electro-plating or sputtering. The reflective layer defines the side wall of the packaged LED. Finally, the substrate is cut horizontally and vertically into individual LED packages.

In our co-pending United States patent application publication No. US 2009/0117672 A1, published May 7, 2009, a method of fabricating a light emitting device having a specific target color of emitted light is described. The method comprises: depositing a pre-selected quantity of the at least one phosphor material on a light emitting surface of the light emitting diode; operating the light emitting diode; measuring the color of light emitted by the device; comparing the measured color with the specific target color; and depositing and/or removing phosphor material to attain the desired target color.

A need exists still for a method of manufacturing light emitting devices with phosphor wavelength conversion that can produce devices with a more consistent color/CCT less expensively than the prior art solutions.

SUMMARY OF THE INVENTION

The present invention arose in an endeavor to address, at least in part, the problem of color hue and/or CCT variation of light emitting devices that include phosphor wavelength conversion and to reduce or even eliminate the need for binning packaged devices.

Embodiments of the invention are directed to processing and patterning the phosphor material for an entire LED wafer containing LEDs prior to dividing and packaging individual LED chips. Unless otherwise indicated the term LED wafer refers to a wafer on which the LED chips are fabricated by depositing layers of n-type and p-type semiconductor materials. This is to be contrasted with a wafer or substrate onto which individual LED chips are mounted during packaging. By way of analogy with the chip manufacturing industry the method of the invention concerns providing the phosphor at the wafer level and can be considered as being at a level termed large scale integration (LSI).

According to the invention there is provided a method of manufacturing a light emitting device comprising: an LED wafer having an plurality of LEDs formed on a surface thereof, the method comprising: a) fabricating a sheet of phosphor/polymer material comprising a light transmissive polymer material having at least one phosphor material distributed throughout its volume and in which the polymer material is transmissive to light generated by the LEDs and to light generated by the at least one phosphor material; b) selectively making apertures through the phosphor/polymer sheet at positions corresponding to electrode contact pads of the LEDs of the LED wafer; c) attaching the sheet of phosphor/polymer material to the surface of the LED wafer such that each aperture overlies a respective electrode contact pad; and d) dividing the LED wafer into individual light emitting devices.

The apertures can be made by mechanical drilling, mechanical punching or laser drilling (laser ablation).

Since there can, for a given LED wafer, be a significant variation in both intensity and wavelength of light emitted from individual LEDs that are nominally the same, the LED wafer is preferably first mapped and the intensity and wavelength of light from each LED measured. The required thickness and weight loading of phosphor to light transmissive polymer of the phosphor/polymer sheet to achieve a selected CCT of light emitted from the device can be calculated from the LED wafer mapping. Every LED on the wafer can be mapped or a representative sample, such as ≈50%, mapped. To avoid the need to remove phosphor, the phosphor loading and/or thickness of the sheet can be selected to correspond to the LEDs requiring the least amount of phosphor. Those devices out of specification can be brought within specification by the subsequent addition of additional phosphor for example when the device is packaged. Alternatively the loading and/or thickness of the phosphor/polymer sheet can be selected to maximize for a given LED wafer the number of devices having a selected CCT of emission product. Advantageously in accordance with the invention the method further comprises selecting the thickness of the sheet of phosphor/polymer material and weight loading of the at least one phosphor material to polymer material of the sheet of phosphor/polymer material on a basis of LEDs on the LED wafer having substantially the same emission characteristics. In one method the selection is made on a basis of LEDs that emit light of substantially the same intensity and/or emission wavelength. Additionally the selection can be made on a basis of the LEDs requiring a least amount of phosphor material and additional phosphor provided to individual devices once the LED wafer is divided to ensure they emit light of a selected color and/or CCT. Alternatively and to maximize the yield of devices from the LED wafer, the selection can be made on the basis of the greatest number of LEDs on the LED wafer having substantially the same emission characteristics.

Prior to dividing the wafer in d) the method can further comprise cutting slots through the sheet of phosphor/polymer material that are configured to pass between individual LEDs when the sheet of phosphor/polymer material is attached to the LED wafer. Such an arrangement of slots aids in the subsequent division of the LED wafer into individual devices. In one implementation the slots are cut after the sheet of phosphor/polymer material has been attached to the LED wafer. In such an arrangement each slot preferably further extends into the LED wafer to thereby aid in subsequent division of the LED wafer. Alternatively, the slots can be cut prior to attaching the sheet of phosphor/polymer material to the LED wafer. In such an arrangement the phosphor/polymer material sheet is attached to a support member, such as a polymer film for example Mylar® or Nitto® tape (manufactured by Nitto Denko Corporation), before cutting the slots. The slots can be cut by mechanical sawing using for example a diamond saw or by laser ablation.

Preferably the phosphor/polymer material sheet is attached to the LED wafer using a light transmissive adhesive such as a silicone, an epoxy or a polyvinyl alcohol. Prior to dividing the wafer in d) the LED wafer is advantageously processed, using for example plasma ashing, to remove any residual adhesive overlying the electrode contact pads. Such residual adhesive can prevent electrical contact being made to the electrode contact pads.

To aid in the removal of debris generated during processing of the phosphor/polymer sheet a sacrificial layer can be provided on the surface of the sheet for collecting debris generated during making of the apertures and/or cutting of the slots. The sacrificial layer can be removable and comprise for example a removable polymer film such as Nitto tape or Mylar film, which is physically removed together with the debris after making the apertures and prior to the cutting of the slots. Alternatively, the sacrificial layer can comprise a dissolvable material, such as for example polyvinyl alcohol (PVA), which is removed from the LED wafer by dissolving it in a solvent after the slots have been cut.

The LED wafer can be divided into individual devices by scribing and breaking, laser ablation or sawing using for example a diamond saw.

According to a further aspect of the invention there is provided a light emitting device with phosphor wavelength conversion manufactured according to the method of the invention.

BRIEF DESCRIPTION OF THE DRAWINGS

In order that the present invention is better understood embodiments of the invention will now be described, by way of example only, with reference to the accompanying drawings in which.

DETAILED DESCRIPTION OF THE INVENTION

Embodiments of the invention concern methods of manufacturing a light emitting device with phosphor wavelength conversion and in particular methods of applying/processing the phosphor material on an LED wafer prior to division of the wafer into individual LED chips. More particularly the method concerns patterning of the phosphor material to enable electrical connections to be made to the LED chip's electrode contacts once the wafer is subsequently divided into individual LED chips. The term "LED wafer" refers to a wafer (substrate) on which the LED chips are fabricated by depositing layers of n-type and p-type semiconductor materials. This is to be contrasted with a wafer (substrate) onto which individual LED chips are mounted post fabrication.

Figures 1A, 1B, 1C, 1D:
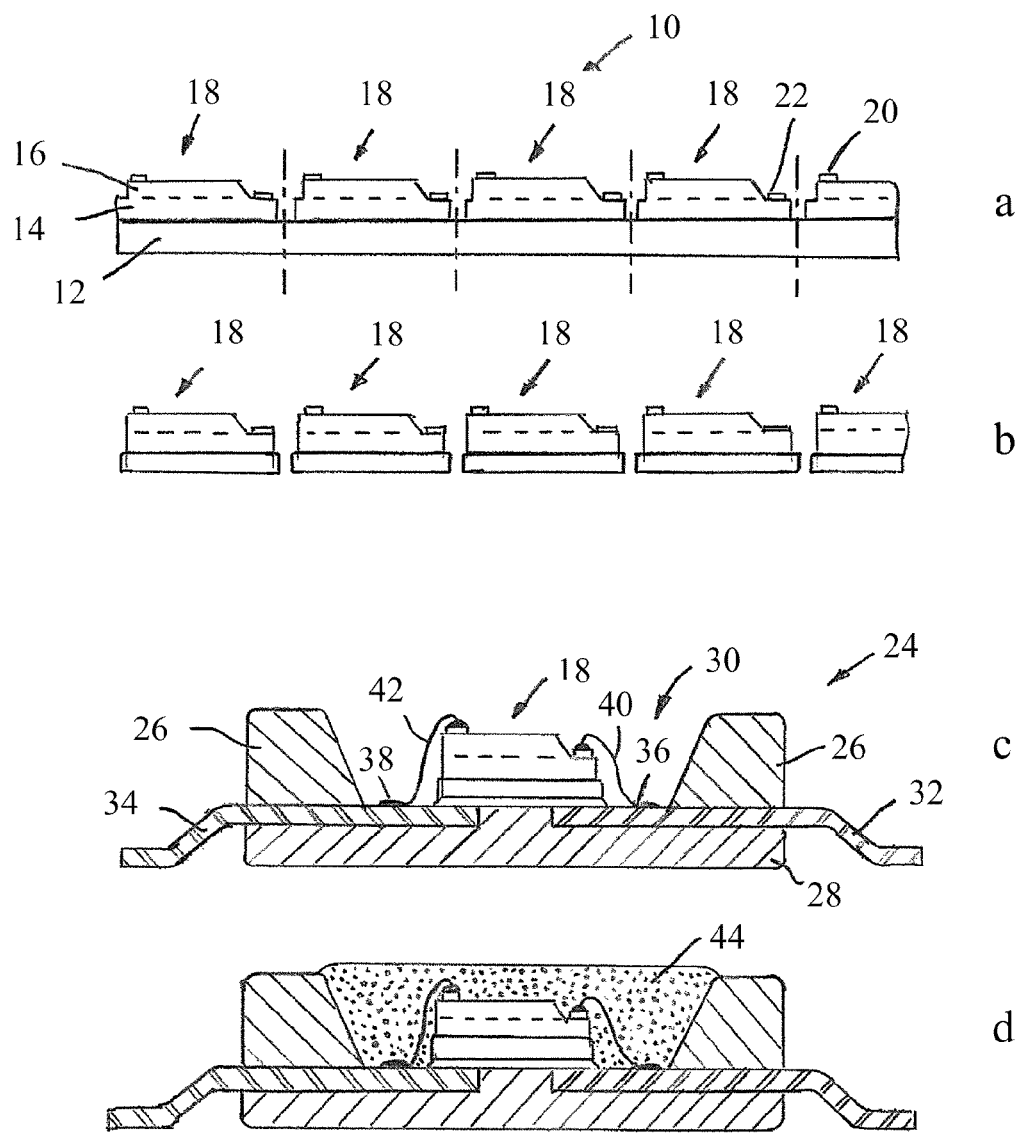
FIGS. 1a to 1d are schematic representations of a known method of manufacture of a light emitting device with phosphor wavelength conversion as previously described.
Figure 2:
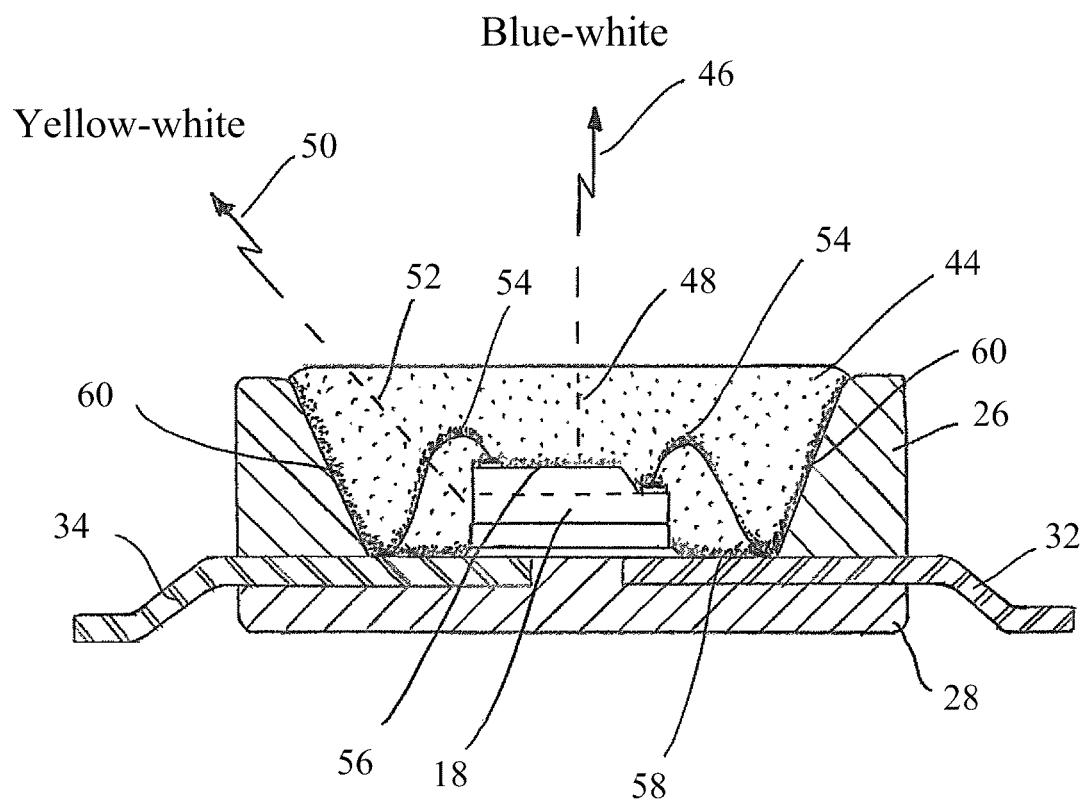
FIG. 2 is a schematic sectional representation of a known light emitting device with phosphor wavelength conversion as previously described.
Figure 3:
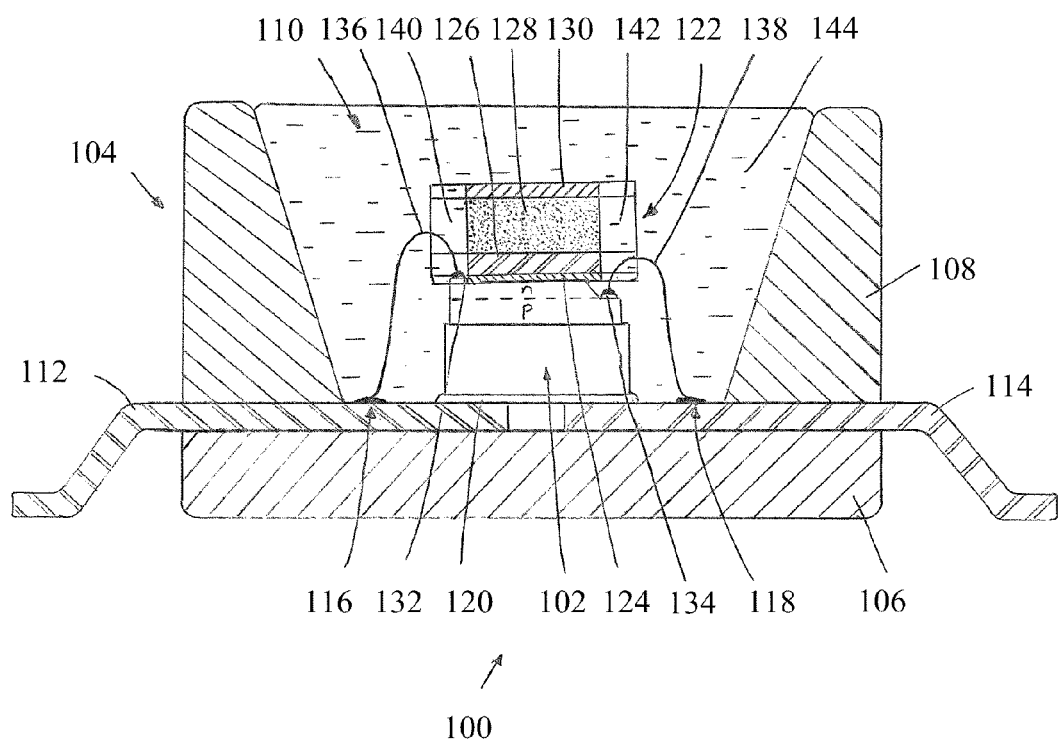
FIG. 3 is a schematic sectional view of a light emitting device with phosphor wavelength conversion in accordance with the invention.

In this specification like reference numerals are used to denote like parts. FIG. 3 is a schematic sectional view of a white light emitting device 100 with phosphor wavelength conversion in accordance with the invention. The device 100 is based on a surface emitting LED chip 102, such as for example a gallium nitride (GaN) based LED chip that emits blue light of wavelength ≈400 nm to ≈450 nm. The LED chip 102 is packaged in a package (housing) 104. The package 104, which can for example comprise a low temperature co-fired ceramic (LTCC) or high temperature polymer, comprises lower and upper body parts 106, 108. The upper body part 108 defines a recess 110, typically circular in shape, which is configured to receive the LED chip 102. The package 104 further comprises electrical connectors 112, 114 that define corresponding electrode contact pads 116, 118 on the floor of the recess 110. Using adhesive or eutectic soldering 120 the LED chip 102 is mounted to the floor of the recess 110. In accordance with the invention the LED chip 102 further comprises a wavelength converting component 122 that is bonded (attached) to the light emitting surface (i.e. upper surface as illustrated) of the LED chip 102 with a light transmissive adhesive 124. The wavelength converting component 122 comprises a layered structure comprising from the light emitting surface of the LED chip an optional thermal barrier layer 126, a phosphor/polymer material layer 128 and an optional passivation layer 130.

N-type and p-type electrode pads 132, 134 on the upper surface of the LED chip 102 are electrically connected to a corresponding electrode contact pad 116, 118 on the floor of the package by bond wires 136, 138 that pass down a respective hole (passage) 140, 142 in the wavelength converting component 122. Having electrically connected the LED chip 102 the recess 110 is then completely filled with a transparent polymer material 144, typically a silicone, to protect the bond wires 136, 138.

Figure 4:
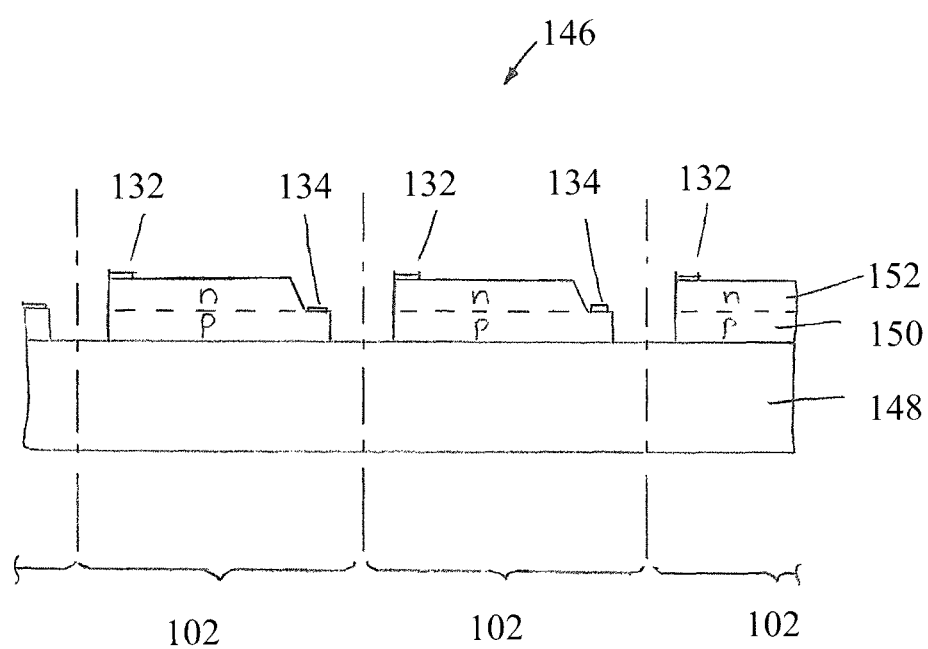
FIG. 4 is a schematic sectional view of a light emitting diode (LED) wafer.

Methods in accordance with the invention will be described in relation to the manufacture of the white light emitting device 100 of FIG. 3 and in particular to the application/processing of the wavelength converting component 122. FIG. 4 is a schematic sectional view of a GaN-based LED wafer 146. The LED wafer 146 comprises a sapphire ($Al_2O_3$) wafer (substrate) 148 on a surface of which there is fabricated a plurality of LED chips 102 in which each LED chip comprises p-type and n-type GaN-based material layers 150, 152 and the n-type and p-type electrodes 132, 134. It will be appreciated that the LED chips shown are highly simplified and intended to be exemplary only. In practice each LED chip will comprise more complex architectures such as for example single quantum well (SQW) or multiple quantum well (MQW) structures, one or more pumping or current spreading layers, n-type and p-type cladding layers, buried electrode layers etc. Whilst in the example described each LED 102 has n-type and p-type electrode pads 132, 134 that are located on the upper light emitting surface, the method of the invention applies equally to LEDs having other electrode configurations such as those in which there is one electrode on the light emitting face and an electrode plane on an opposite face. Typically the sapphire wafer 148 is a two inch diameter circular wafer of thickness ≈500 nm on which between 500 and 10,000 LED chips 102 are fabricated. The method will be described in relation to the fabrication/processing of the wavelength converting component 122 for a two inch wafer with ≈1500, 1 mm×1 mm LED chips 102.

Method 1

A method in accordance with a first embodiment of the invention will be described in relation to FIGS. 5a to 5g which show schematically the method steps of the invention for fabricating the white light emitting device 100 of FIG. 3 with a specific CCT (for example 3000K).

Figures 5A, 5B:
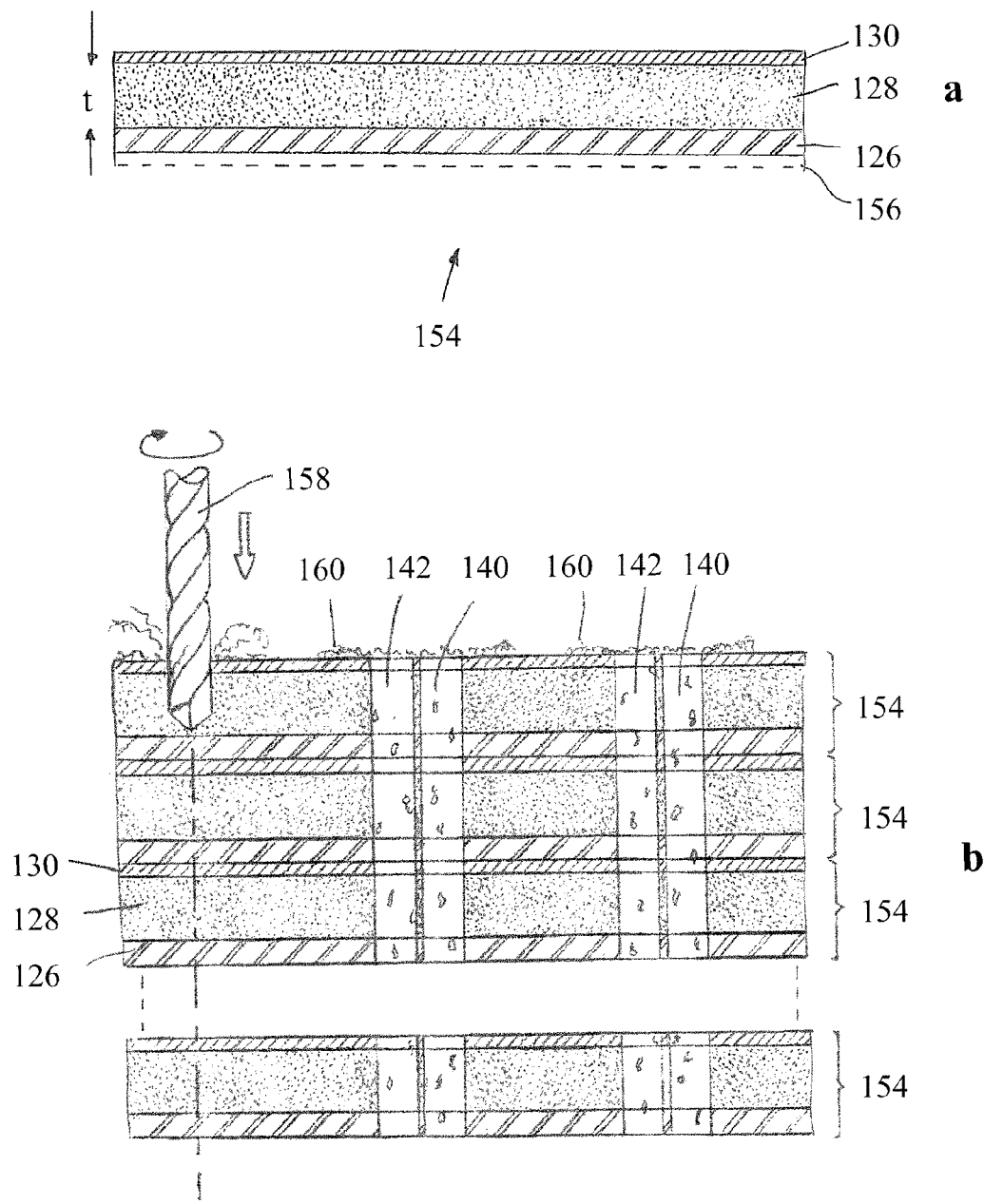
FIGS. 5a to 5g are schematic representations of method steps for manufacturing the light emitting device of FIG. 3 according to a method of the invention.

Step 1—FIG. 5a: Firstly a layered sheet of phosphor material 154 is fabricated. The phosphor sheet 154 comprises, in order, the optional light transmissive thermal barrier layer 126, the phosphor/polymer layer 128 and the optional light transmissive passivation layer 130.

As is known on a given LED wafer there can be a significant variation in both intensity and wavelength of light emitted from individual LED chips that are nominally the same. In order to determine the required thickness "t" (FIG. 5a) and weight loading of phosphor material to light transmissive polymer of the phosphor/polymer layer 128 to achieve a selected CCT, the LED wafer can be first mapped by powering individual LEDs on the LED wafer using probes and the intensity and wavelength of emitted light from each measured. Every LED on the wafer can be mapped or a representative sample, such as ≈50%, mapped. The required weight loading and thickness "t" is calculated from the LED wafer mapping. The phosphor loading and/or thickness "t" can be matched to the LED chips requiring the least amount of phosphor to avoid the need to remove phosphor. Those devices out of specification can be brought within specification by subsequent addition of additional phosphor. Alternatively the loading and/or thickness of the phosphor/polymer layer 128 can be selected to maximize for a given LED wafer the number of devices having a selected having CCT of the emission product.

The phosphor (photoluminescent) material, which is in powder form, is thoroughly mixed in pre-selected proportions with a light transmissive (transparent) polymer material such as for example a transparent silicone or epoxy. Examples of light transmissive polymer materials can include Shin-Etsu MicroSi, Inc's flexible silicone KJR-9022 and GE's silicone RTV615. The weight ratio loading of phosphor to silicone is typically in a range 35 to 85 parts per 100 with the exact loading depending on the required CCT of the emission product. In this first embodiment the phosphor/polymer sheet 154 is self-supporting such that it can be processed without the need of a supporting substrate. The phosphor/polymer mixture can be extruded to form a homogeneous phosphor/polymer sheet 128 of uniform thickness "t" with a uniform distribution of phosphor throughout its volume. The phosphor/polymer sheet 128 is typically of thickness of the order 100 µm to 200 µm. As in the case of the weight loading of the phosphor to polymer, the thickness "t" of the phosphor/polymer layer 128 will depend on the target CCT of light generated by the device. The thermal barrier 126 and passivation 130 layers are then applied to the phosphor/polymer sheet 128 to produce the phosphor sheet 154.

The thermal barrier layer 126 comprises a light transmissive (transparent) material with a low thermal conductivity such as a silicone, epoxy, polycarbonate or other polymer material and reduces thermal degradation of the phosphor in the finished device by reducing and/or preventing the conduction of heat from the LED chip 102, in particular the light emitting face of the chip, to the phosphor/polymer layer 128. Typically, the thermal barrier layer 126 has a thickness of the order of 5 µm and preferably has an index of refraction comparable to the material of the light emitting face of the LED chip to provide refractive index matching and promote coupling of the light into the phosphor sheet 154. Alternatively, the laminated phosphor sheet can, optionally, further include one or more refractive index matching layer(s) 156 located on the thermal barrier layer 126. In FIG. 5a the index matching layer 156 is indicated by a dashed line and is not included in remaining drawings.

The passivation layer 130 which provides environmental protection of the phosphor/polymer layer 128 by reducing the ingress of moisture into the phosphor material can comprise a polymer material such as a silicone material or a silica material such as a spin on glass formed using a colloidal silica (silica sol) such as tetraethyl orthosilicate (TEOS-Si $(OCH_2CH_3)_4$) or tetramethyl orthosilicate (TMOS-Si $(OCH_3)_4$). The passivation layer is coated onto the phosphor/polymer layer 128 by spin-coating, doctor blading, tape-casting, spraying, inkjet printing or by other deposition techniques that will be apparent to those skilled in the art. When the passivation layer comprises a spin on glass the passivation layer is heat treated to convert the material to silica ($SiO_2$). Typically the passivation layer is of a thickness of order 10 µm to 20 µm.

Step 2—FIG. 5b: A number, for example ten, phosphor/polymer sheets 154 are stacked one on top another and a series of holes 140, 142 mechanically drilled 158 through the entire thickness of the stack of sheets. It is envisaged in an alternative implementation to drill the holes by laser drilling. The location of the holes 140, 142 are selected such that each hole corresponds to the position of an associated LED n-type or p-type electrode contact pad 132, 134 on the LED wafer 146. The holes are typically of order 50 µm to 100 µm in diameter resulting in aspect ratio of the through holes of order 1:1. In a surface emitting LED the electrode contact pads 132, 134 are located on the light emitting face close to the edges of the chip to maximize LED light emission and depending on the packing density of LEDs 102 on the LED wafer the holes 140, 142 corresponding to neighboring LEDs will typically extend into slots that are subsequently formed between the LEDs (see Step 4) or may overlap each other (not shown). It is envisaged that it should be possible to mechanically drill approximately 1200 holes per minute enabling the 3,000 or so holes needed (e.g. 3000 for an LED wafer with 1500 LEDs) to be drilled in approximately 2 to 5 minutes. It will be appreciated that this time can be further reduced by using a drill with multiple drill bits. Debris 160 that is generated during the drilling process accumulates on the surface of the passivation layer 130 of the uppermost phosphor sheet 154.

Figure 5C:
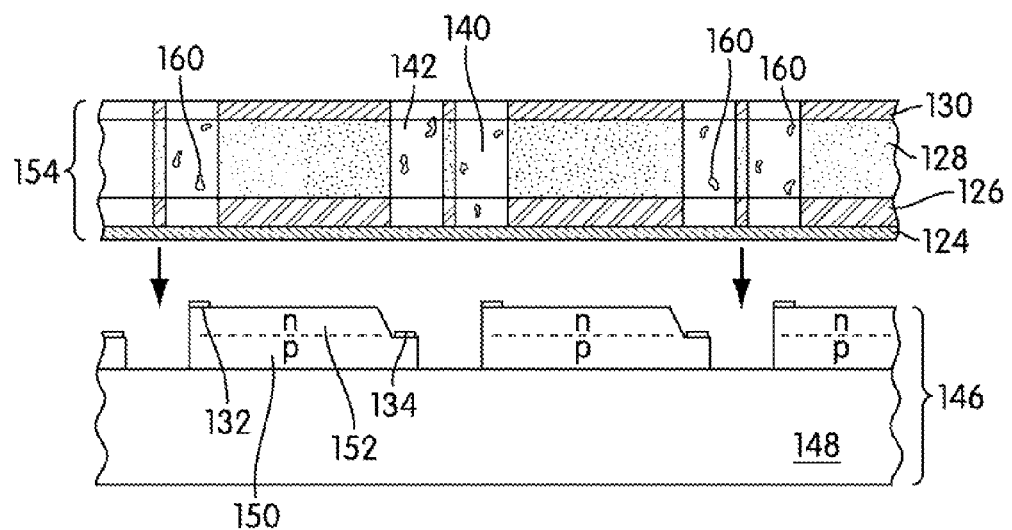
Figure 5D:
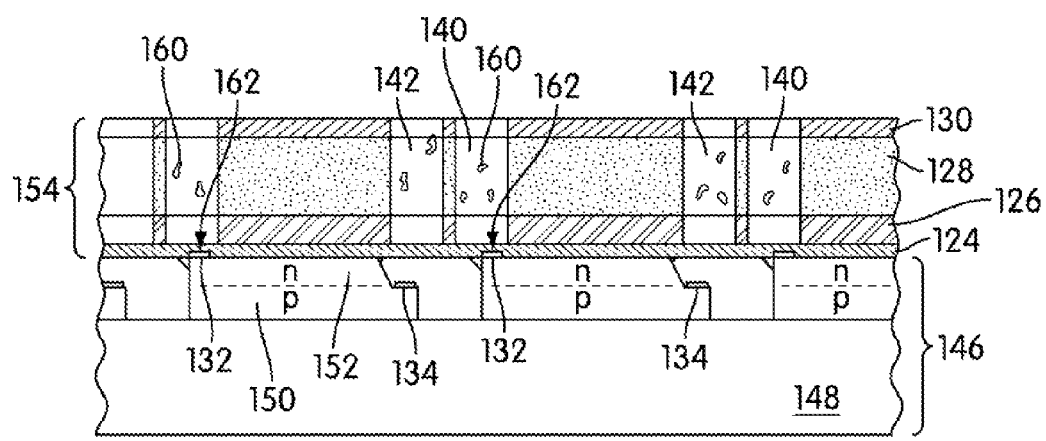

Step 3—FIGS. 5c and 5d: The debris 160 is removed and the drilled phosphor/polymer sheet 154 is attached to the LED wafer 146 using a light transmissive (transparent) adhesive 124 with the thermal barrier layer 126 facing the light emitting surface of the LED wafer 146. The phosphor sheet 154 is accurately positioned such that the through-holes (via) 140, 142 overlie an associated n-type or p-type LED electrode contact pad 132, 134 on the LED wafer 146. For ease of fabrication the adhesive 124 can be applied to the surface of the phosphor/polymer sheet by spin-coating, doctor blading, tape-casting, spraying, inkjet printing or by other deposition techniques that will be apparent to those skilled in the art and the phosphor sheet 154 then brought into contact with the LED wafer 146. The adhesive preferably comprises a silicone, epoxy or other polymer material. In one arrangement it is envisaged to use a polyvinyl alcohol (PVA). Since PVA is hydrophilic whilst the silicone is hydrophobic it is envisaged to add a solvent such as isopropyl alcohol to the PVA to enable proper wetting of the phosphor/polymer sheet to the LED wafer.

Figure 5E:
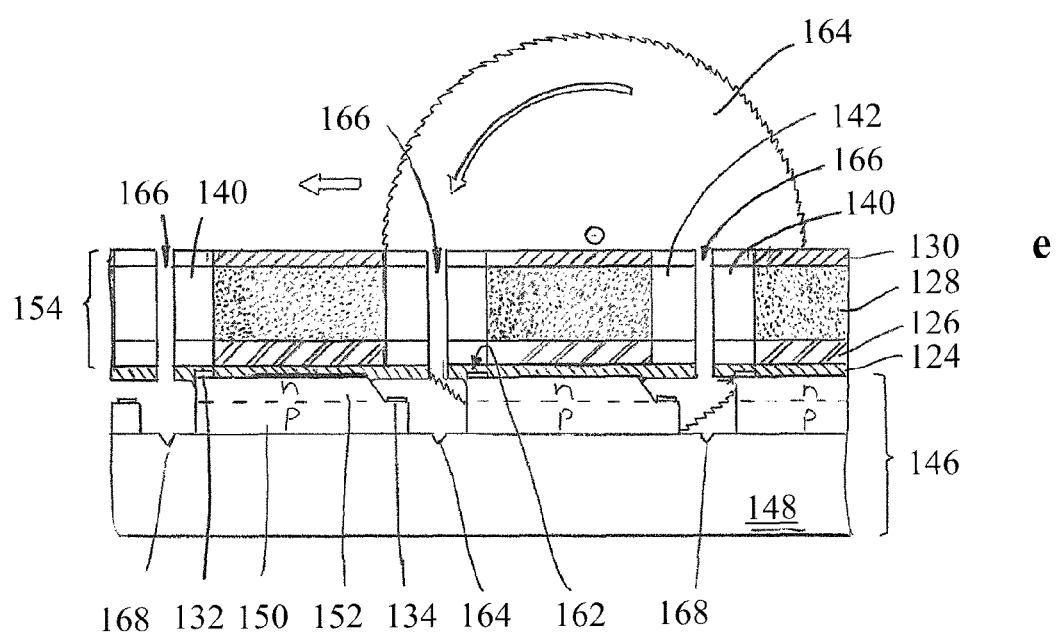

Step 4—FIG. 5e: The phosphor sheet 154 (i.e. the passivation 130, phosphor/polymer layer 128 and thermal barrier layer 126) is cut 164 in mutually orthogonal directions (x- and y-directions) to form a square grid of slots 166 that pass through the entire thickness of the phosphor sheet 154 and partially into the underlying sapphire wafer 168. The slots 166, hereinafter referred to as "streets" and "avenues", are configured to run between LED chips 102 and correspond to where the LED wafer 146 will be subsequently divided into individual LED chips 102. In FIG. 5e the slots 166 run into and out of the plane of the paper in a y-direction. There are no slots running in an x-direction indicated in FIG. 5e. The streets and avenues can be cut using a diamond saw or by laser ablation.

Figure 5F:
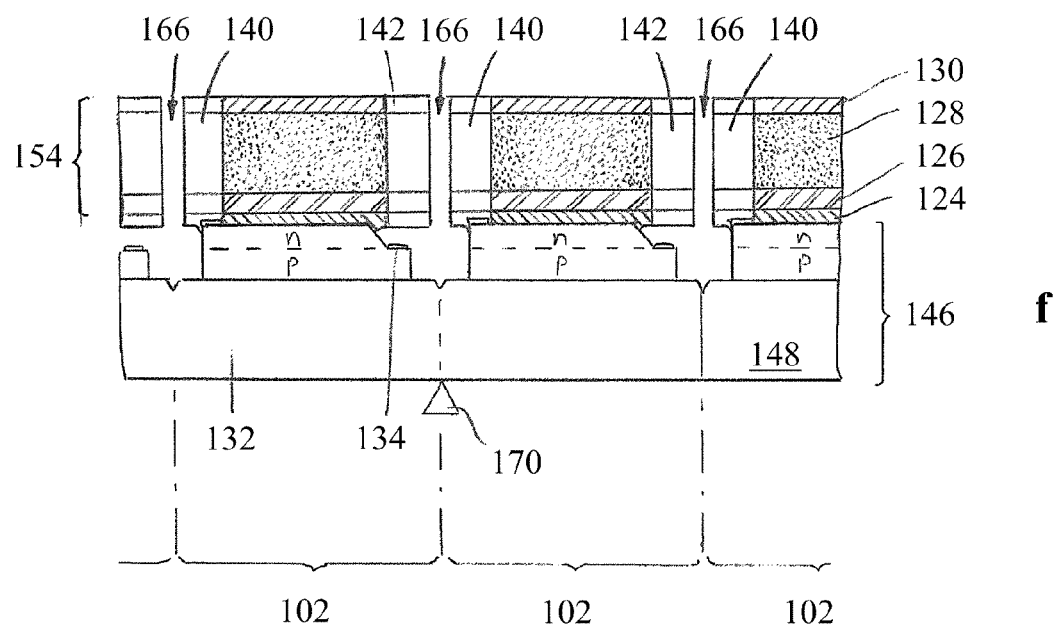
Figure 5G:
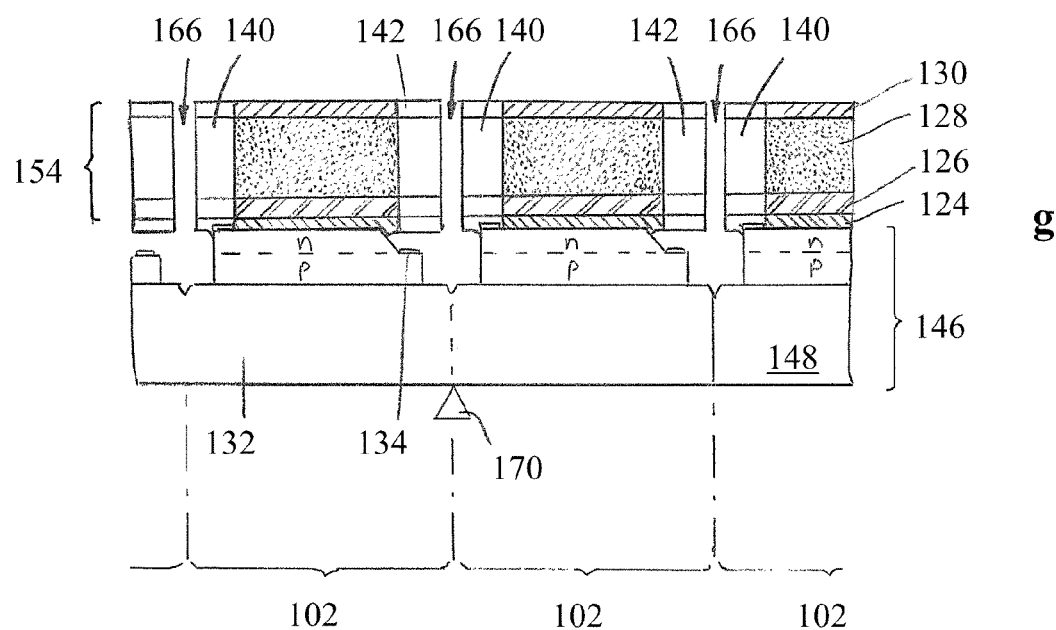

Step 5—FIGS. 5f and 5g: The LED wafer with attached phosphor/polymer sheet is then processed, using for example plasma ashing, to remove any adhesive 162 and/or other debris 160 at the base of the holes 140, 142 overlying the electrode pads 132, 134. The LED wafer 146 is divided (diced) into individual LED chips 102 by breaking (snapping) 170 the substrate 148 along the lines 168 corresponding to the streets and avenues 166. Alternatively, the LED wafer can be divided by cutting using a diamond saw or by other techniques that will be readily apparent to those skilled in the art. Finally each LED chip 102 is packaged as previously described in relation to FIG. 3.

Figure 6:
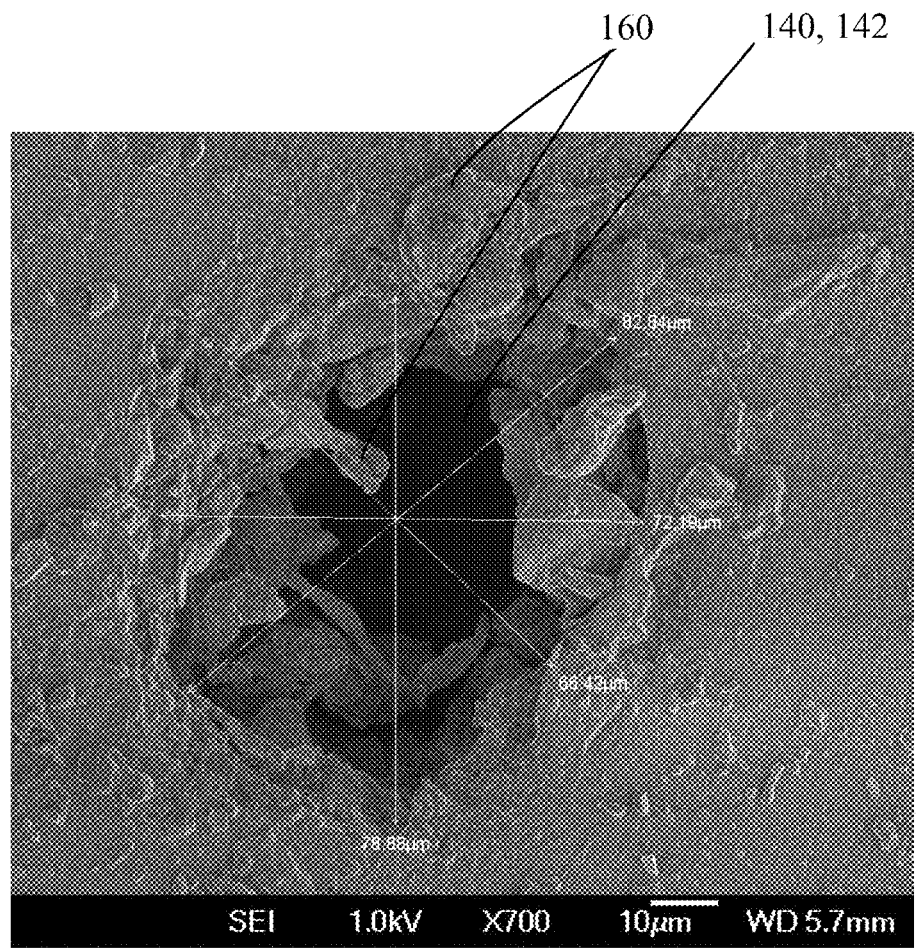
FIG. 6 is an electron micrograph of a mechanically drilled hole in a sheet of phosphor/polymer material in accordance with the invention.

FIG. 6 is an SEM (Scanning Electron Microscope) electron micrograph of a mechanically drilled hole 140 in a sheet of phosphor/polymer material 128. The light transmissive polymer material is GE's RTV615 silicone and the hole drilled using a 100 µm drill bit. As can be seen from FIG. 6 the hole is undersized and oval in form having dimensions ≈66 µm by ≈80 µm. It is believed that the hole is undersized due to the resiliently deformable nature of the silicone material which deforms when drilling. To reduce hole deformation it is envisioned to use a less flexible light transmissive polymer material such as one of Shin-Etsu MicroSi, Inc's rigid silicones KJR-651E, KJR-654E and KJR-653E. The debris 160 within the hole 140 can be removed by plasma etching after the phosphor/polymer sheet is attached to the LED wafer (FIG. 5d).

Figure 7:
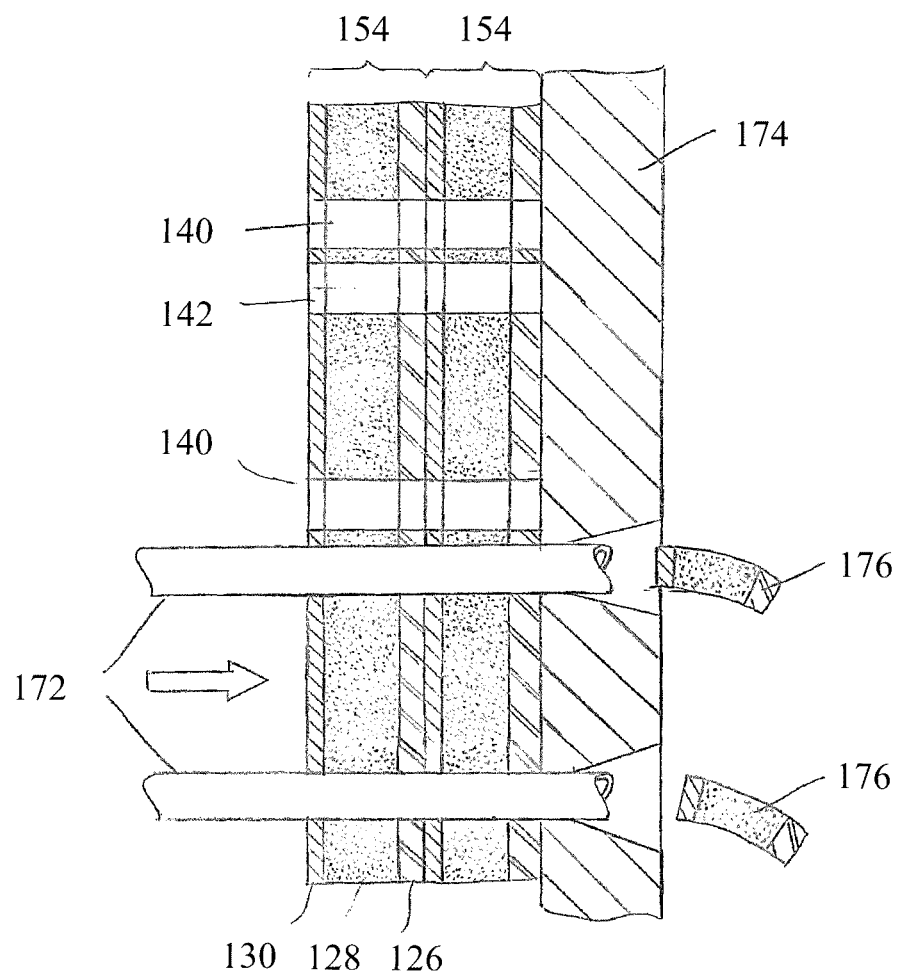
FIG. 7 is a schematic representation of an alternative method step according to a method of the invention.

It is envisaged in an alternative method in accordance with the invention to form the holes 140, 142 in the phosphor/polymer sheet 154 by mechanical punching. FIG. 7 illustrates such a method step which can be used as an alternative to drilling step 2 illustrated in FIG. 5b. Referring to FIG. 7 a stack, for example two to five, phosphor/polymer sheets 154 are oriented vertically for mechanically punching the holes 140, 142 through the entire thickness of the stack of phosphor/polymer sheets. Punching the stack in a vertical orientation has the benefit of reducing friction between the phosphor sheets and punch plate thereby making it is easier to accurately move the stack relative to the punch. To reduce the fabrication time the punch head preferably comprise multiple punches 172 (two are illustrated in FIG. 7) and a complimentary punch plate 174. Plugs 176 of punched phosphor/polymer sheet material are discarded.

Method 2

In a second method in accordance with the invention the phosphor/polymer sheet 154 is cut into regions corresponding to individual LED chips before mounting the processed phosphor/polymer sheet to the LED wafer 146. FIGS. 8*a* to 8*e* illustrate such method steps that can be used as an alternative to the steps 1 to 4 illustrated in FIGS. 5*a* to 5*e*. Additionally, the second method can be used to drill and/or cut a phosphor/polymer sheet that is too flexible to be processed without the aid of a support.

Figure 8A:
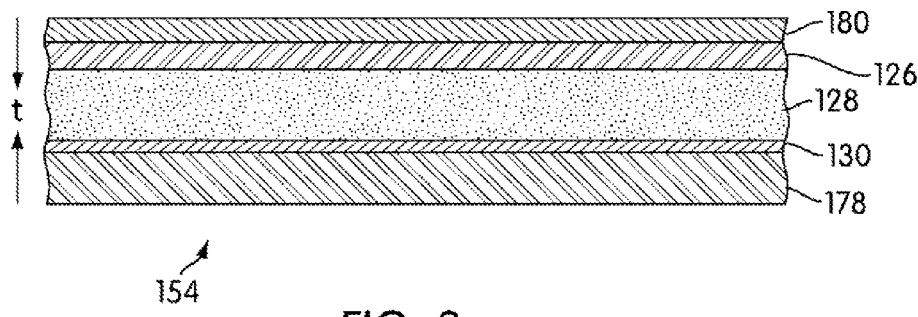
FIGS. 8a to 8e are schematic representations of alternative method steps according to a method of the invention.

Step 1—FIG. 8*a*: In this embodiment the phosphor sheet 154 is supported and/or formed on a removable support member 178. The support member can comprise a polymer film such as Mylar® or Nitto® tape (manufactured by Nitto Denko Corporation) that is stretched taut over a frame (not shown). As in the in the first method of the invention the phosphor sheet 154 comprises, in order, an optional light transmissive thermal barrier layer 126, a phosphor/polymer layer 128 and an optional light transmissive passivation layer 130. The passivation layer 130 is in contact with the support member 178. Additionally the phosphor sheet further comprises a sacrificial layer 180 over the entire surface of the thermal barrier layer 126. The sacrificial layer 180 is used to provide protection of the phosphor/polymer layer 128 (thermal barrier layer 126 when present) and is used to collect debris generated during subsequent processing of the phosphor/polymer sheet 154. The sacrificial layer 180 preferably comprises a dissolvable material such as polyvinyl alcohol (PVA) that is coated onto the thermal barrier layer 126 by spin-coating, doctor blading, tape-casting, spraying, inkjet printing or by other deposition techniques that will be apparent to those skilled in the art. Typically the sacrificial layer 176 is of thickness of order 10 μm to 20 μm. Since PVA is hydrophilic whilst the silicone in the thermal barrier and/or phosphor/polymer layer 128 is hydrophobic it is envisaged to add a solvent such as isopropyl alcohol to the PVA to enable proper wetting of the sacrificial layer to the thermal barrier layer. Alternatively, as will be described the sacrificial layer 176 can comprise a removable polymer film such as Mylar® or Nitto® tape.

Figure 8B:
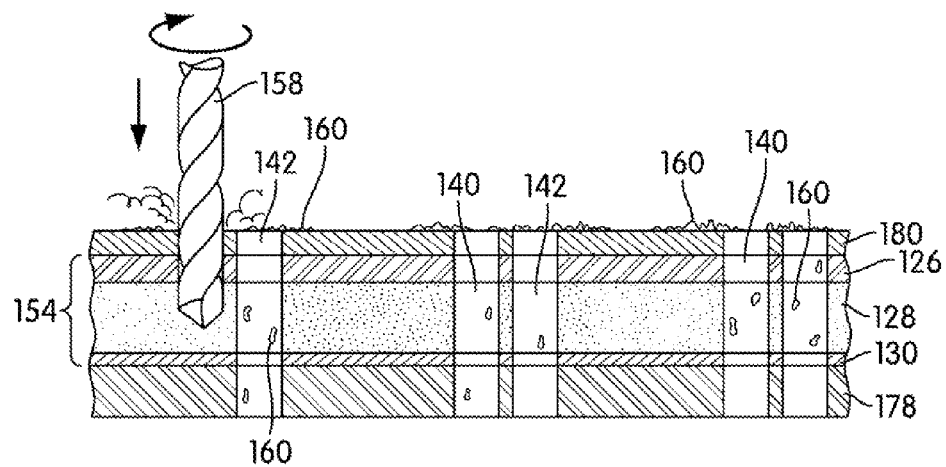

Step 2—FIG. 8*b*: The holes 140, 142 are drilled 154 through the entire thickness of the phosphor sheet and support member 178 using mechanical or laser drilling. The location of the holes 140, 142 are selected such each hole corresponds to the position of an associated LED n-type or p-type electrode contact pad 132, 134 on the LED wafer 142. The holes are typically of order 80 μm to 100 μm in diameter. Debris 160 that is generated during the drilling process accumulates on the surface of the sacrificial layer 180. When using a removable sacrificial layer 180 such as Mylar® or Nitto® tape this can be physically removed together with the debris 160 prior to cutting the slots 166 (Step 3).

Figure 8C:
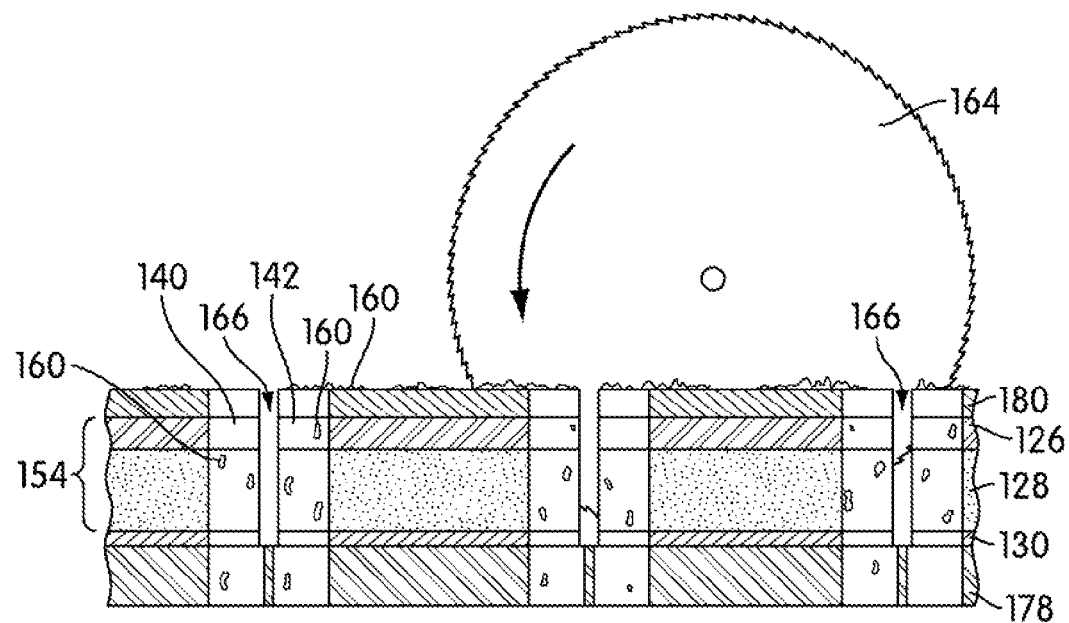

Step 3—FIG. 8*c*: The phosphor/polymer sheet 154 is cut 164 in mutually orthogonal directions (x- and y-directions) to form the grid of streets and avenues (slots) 166 that pass through the entire thickness of the phosphor/polymer sheet 154. Debris 160 from the sawing operation also collects on the sacrificial layer 180. The sacrificial layer 180 is removed together with the debris 160 by dissolving the sacrificial layer in a suitable solvent, preferably water.

Figure 8D:
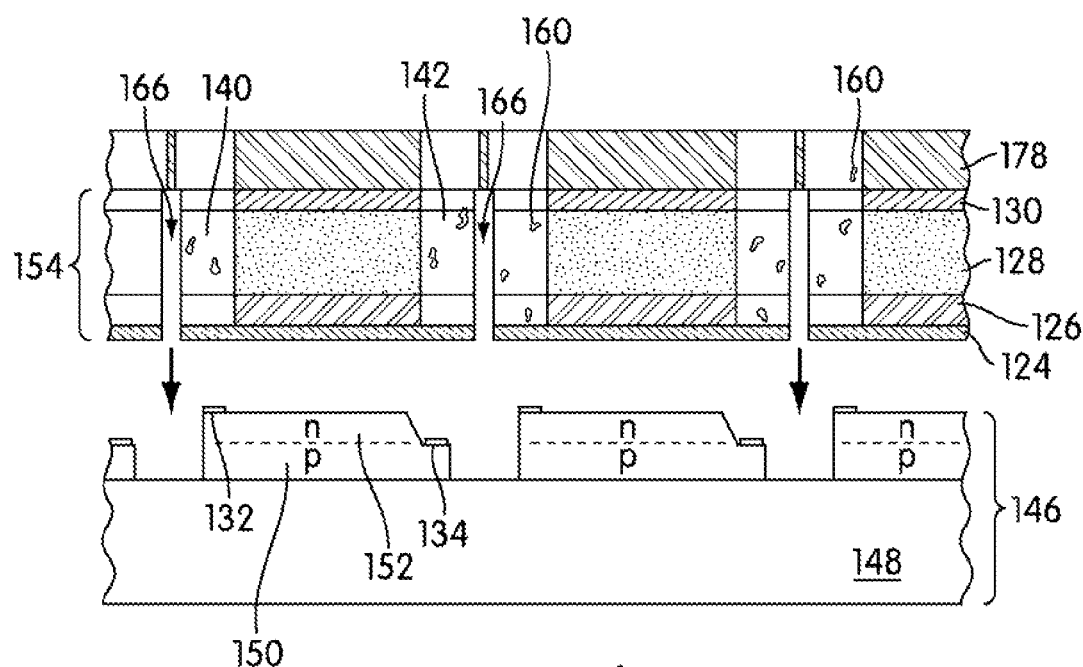
Figure 8E:
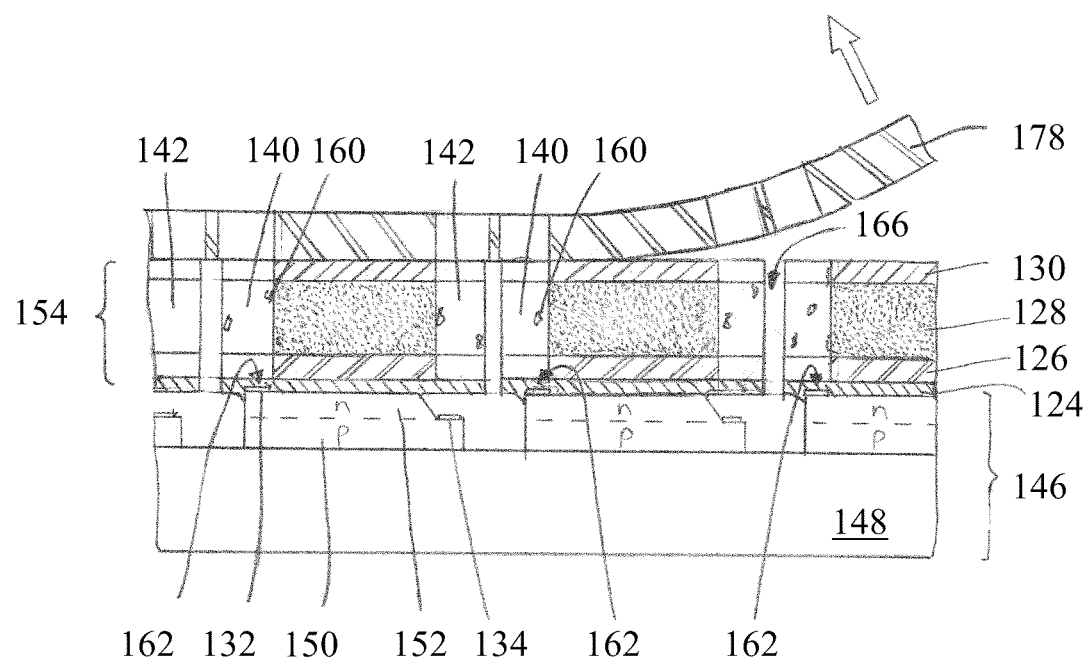

Step 4—FIGS. 8*d* and 8*e*: The drilled/cut phosphor/polymer sheet 154 is attached to the LED wafer 146 using a light transmissive (transparent) adhesive 124 with the thermal barrier layer 126 facing the light emitting surface of the LED wafer 146. The phosphor sheet 154 is accurately positioned such that each through-holes 140, 142 overlies an associated LED n-type or p-type electrode contact pad 132, 134 and the streets and avenues 166 correspond to the gaps between individual LED chips 102. For ease of fabrication the adhesive 124 is applied to the surface of the phosphor/polymer sheet 154 by spin-coating, doctor blading, tape-casting, spraying, inkjet printing or by other deposition techniques that will be apparent to those skilled in the art and the phosphor sheet 154 then brought into contact with the LED wafer 146. The adhesive preferably comprises a silicone, epoxy or other polymer material. In one arrangement it is envisaged to use a poly vinyl alcohol (PVA). Since PVA is hydrophilic whilst the silicone is hydrophobic it is envisaged to add a solvent such as isopropyl alcohol to the PVA to enable proper wetting of the phosphor/polymer sheet to the LED wafer. Once the adhesive 124 has set the support member 178 is removed. The LED wafer 146 is then processed, for example using plasma ashing, to remove any residual adhesive 162 overlying the LED electrode pads 132 and finally the LED wafer 146 diced into individual devices.

The methods in accordance with the invention can be used in the high volume production of light emitting devices with phosphor wavelength conversion. A particular benefit of the methods of the invention is that they can produce devices with a more consistent color and/or CCT and can eliminate the need for binning.

The methods of the invention are suitable for applying phosphor material(s) in a powder form which can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending U.S. patent application publication No. US 2007/0029526 A1 and U.S. Pat. No. 7,311,858 B2, U.S. Pat. No. 7,575,697 B2 and U.S. Pat. No. 7,601,276 B2 (all assigned to Internatix Corporation) the content of each of which is hereby incorporated by way of reference thereto.

As taught in U.S. Pat. No. 7,575,697 B2, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 B2 disclose a silicate-based yellow-green phosphor having a formula $A_2SiO_4:Eu^{2+}D$, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4$:$Eu^{2+}D$ in which M comprises Ca, Mg, Zn or Cd and where $0 \le x \le 1$ and $0 \le y \le 1$.

U.S. Pat. No. 7,601,276 B2 teach a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US 2007/0029526 A1 disclose a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending U.S. patent application publication No. US 2006/0158090 A1 and U.S. Pat. No. 7,390,437 B2 (also assigned to Internatix Corporation) or an aluminum-silicate phosphor as taught in co-pending application US 2008/0111472 A1 the content of each of which is hereby incorporated by way of reference thereto.

US 2006/0158090 A1 to Wang et al. teach an aluminate-based green phosphor of formula $M_{1-x}Eu_xAl_yO_{[1+3y/2]}$ in which M is at least one of a divalent metal comprising Ba, Sr, Ca, Mg, manganese (Mn), Zn, copper (Cu), Cd, samarium (Sm) or thulium (Tm) and in which $0.1<x<0.9$ and $0.5 \le y \le 12$.

U.S. Pat. No. 7,390,437 B2 disclose an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \le y \le 12$ and $0.8 \le z \le 1.2$. The phosphor can be further doped with a halogen dopant H such as Cl, Br or I and be of general composition $(M_{1-x}Eu_x)_{2-z}Mg_zAl_yO_{[2+3y/2]}$:H.

US 2008/0111472 A1 to Liu et al. teach an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \le x \le 0.4$; T is a trivalent metal selected from Y, lanthanum (La), Ce, praseodymium (Pr), neodymium (Nd), promethium (Pm), Sm, gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \le y \le 0.4$ and z and m are in a range $0 \le z \le 0.2$ and $0.001 \le m \le 0.5$. The phosphor is configured such that the halogen resides on oxygen lattice sites within the silicate crystal.

The phosphor can also comprise a nitride-based red phosphor material such as is taught in our co-pending United States patent applications Publication No. US 2009/0283721 A1 published Nov. 19, 2009 and Ser. No. 12/632,550 filed Dec. 7, 2009 entitled "Nitride-based red-emitting phosphors in RGB (red-green-blue) lighting systems", the content of each of which is hereby incorporated by way of reference thereto. US 2009/0283721 A1 and Ser. No. 12/632,550 teach nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, indium (In), Y, selenium (Se), P, arsenic (As), La, Sm, antimony (Sb) or Bi; $M_b$ is a tetravalent element selected from C, Si, Ge, tin (Sn), Ni, hafnium (Hf), molybdenum (Mo), tungsten (W), chromium (Cr), lead (Pb), titanium (Ti) or zirconium (Zr); D is a halogen selected from F, Cl, Br or I; Z is an activator selected from europium (Eu), Ce, manganese (Mn), Tb or samarium (Sm), and N is nitrogen in amounts $0.01 \le m \le 1.5$, $0.01 \le a \le 1.5$, $0.01 \le b \le 1.5$, $0.0001 \le w \le 0.6$ and $0.0001 \le z \le 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG).

It will be further appreciated that the present invention is not restricted to the specific embodiments described and that variations can be made that are within the scope of the invention. For example, the method of the invention can be used to the application/processing of the phosphor/polymer layer on other LED wafers such as silicon carbide (SiC), zinc selenide (ZnSe), indium gallium nitride (InGaN), aluminum nitride (AlN) or aluminum gallium nitride (AlGaN) based LED chips.

What is claimed is:

1. A method of manufacturing a light emitting device (LED), the method comprising:
   a) providing an LED wafer having a plurality of LEDs formed on a surface thereof;
   b) fabricating a sheet of phosphor/polymer material comprising a light transmissive polymer material having at least one phosphor material distributed throughout its volume and in which the polymer material is transmissive to light generated by the LEDs and to light generated by the at least one phosphor material;
   c) selectively making apertures through the sheet of phosphor polymer material at positions corresponding to electrode contact pads of the LEDs of the LED wafer;
   d1) attaching the sheet of phosphor polymer material to the surface of the LED wafer such that each aperture overlies a respective electrode contact pad, and
   d2) cutting slots through the sheet of phosphor/polymer material that are configured to pass between individual LEDs prior to said attaching the sheet to the LED; and
   e) dividing the LED wafer into individual light emitting devices.

2. The method according to claim 1, wherein the slots are cut by a method selected from the group consisting of: laser ablation and mechanical sawing.

3. The method according to claim 1, and comprising making the apertures using a method selected from the group consisting of: mechanical drilling, mechanical punching and laser ablation.

4. The method according to claim 1, further comprising mapping the intensity and wavelength of light from the plurality of LEDs, and 1) selecting a phosphor sheet thickness or phosphor sheet phosphor loading providing a thickness and loading achieving a selected correlated color temperature (CCT) for one or more LEDs requiring the least amount of phosphor on the wafer, or 2) selecting a phosphor sheet thickness or phosphor sheet phosphor loading providing a thickness and loading achieving a selected correlated color temperature for the greatest number of LEDs on the wafer.

5. A method of manufacturing a light emitting device (LED), the method comprising:

a) providing an LED wafer having a plurality of LEDs formed on a surface thereof;
b) fabricating a sheet of phosphor/polymer material comprising a light transmissive polymer material having at least one phosphor material distributed throughout its volume and in which the polymer material is transmissive to light generated by the LEDs and to light generated by the at least one phosphor material;
c) providing a sacrificial layer over the sheet of phosphor/polymer material for collecting debris generated during making of the apertures, wherein the sacrificial layer is adapted to be mechanically removable from the wafer in one piece;
d) selectively making apertures through the phosphor/polymer sheet at positions corresponding to electrode contact pads of the LEDs of the LED wafer;
e) attaching the sheet of phosphor polymer material to the surface of the LED wafer such that each aperture overlies a respective electrode contact pad; and
f) dividing the LED wafer into individual light emitting devices.

6. The method according to claim 5, and further comprising removing the sacrificial layer and debris after making the apertures.

7. The method according to claim 6, wherein the sacrificial layer is adapted to be dissolvable and is removed from the wafer by contacting with water or isopropyl alcohol.

8. The method according to claim 6, wherein the sacrificial layer is selected from the group consisting of: polyvinyl alcohol, a polymer film, Nitto tape and Mylar.

9. The method according to claim 5, and comprising making the apertures using a method selected from the group consisting of: mechanical drilling, mechanical punching and laser ablation.

10. The method according to claim 5, further comprising mapping the intensity and wavelength of light from the plurality of LEDs, and 1) selecting a phosphor sheet thickness or phosphor sheet phosphor loading providing a thickness and loading achieving a selected correlated color temperature (CCT) for one or more LEDs requiring the least amount of phosphor on the wafer, or 2) selecting a phosphor sheet thickness or phosphor sheet phosphor loading providing a thickness and loading achieving a selected correlated color temperature for the greatest number of LEDs on the wafer.

11. A method of manufacturing a light emitting device (LED), the method comprising:
a) providing an LED wafer having a plurality of LEDs formed on a surface thereof;
b) fabricating a phosphor sheet comprising a phosphor/polymer material layer comprising a light transmissive polymer material having at least one phosphor material distributed throughout its volume and in which the polymer material is transmissive to light generated by the LEDs and to light generated by the at least one phosphor material;
c) selectively making apertures through the phosphor sheet at positions corresponding to electrode contact pads of the LEDs of the LED wafer;
d) forming slots partially into the wafer between the LEDs; and,
e) attaching the phosphor sheet to the surface of the LED wafer such that each aperture overlies a respective electrode contact pad.

12. A method of manufacturing a light emitting device (LED), the method comprising:
a) providing an LED wafer having a plurality of LEDs formed on a surface thereof;
b) fabricating a phosphor sheet comprising a phosphor/polymer material layer comprising a light transmissive polymer material having at least one phosphor material distributed throughout its volume and in which the polymer material is transmissive to light generated by the LEDs and to light generated by the at least one phosphor material;
c) providing a sacrificial layer over the sheet of phosphor/polymer material;
d) selectively making apertures through the phosphor sheet at positions corresponding to electrode contact pads of the LEDs of the LED wafer;
e) cutting through the sheet of phosphor/polymer material; and,
f) attaching the phosphor sheet to the surface of the LED wafer such that each aperture overlies a respective electrode contact pad.

13. The method of claim 12, further comprising breaking the wafer along the slots to divide the wafer into individual LEDs.

14. A method of manufacturing a light emitting device (LED), the method comprising:
a) providing an LED wafer having a plurality of LEDs formed on a surface thereof;
b) fabricating a sheet of phosphor/polymer material comprising a light transmissive polymer material having at least one phosphor material distributed throughout its volume and in which the polymer material is transmissive to light generated by the LEDs and to light generated by the at least one phosphor material; and,
c) cutting slots through the sheet of phosphor/polymer material, which slots are positioned to align between individual LEDs, then attaching the sheet of phosphor polymer material to the surface of the LED with the slots aligned with corresponding gaps between individual LED chips.

15. The method of claim 14, further comprising cutting into the wafer to divide the individual LEDs.

16. The method of claim 14, further comprising dividing the LED wafer into individual light emitting devices along the gaps between individual chips.

* * * * *